United States Patent
Rafi et al.

(10) Patent No.: US 8,774,750 B2
(45) Date of Patent: *Jul. 8, 2014

(54) METHOD AND APPARATUS FOR CONTROLLING A HARMONIC REJECTION MIXER

(71) Applicant: Silicon Laboratories Inc., Austin, TX (US)

(72) Inventors: Aslamali A. Rafi, Austin, TX (US); Alessandro Piovaccari, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/930,254

(22) Filed: Jun. 28, 2013

(65) Prior Publication Data

US 2013/0288627 A1    Oct. 31, 2013

Related U.S. Application Data

(60) Continuation of application No. 12/947,285, filed on Nov. 16, 2010, now Pat. No. 8,543,077, which is a division of application No. 11/824,418, filed on Jun. 29, 2007, now Pat. No. 7,860,480.

(51) Int. Cl.
*H04B 1/26*    (2006.01)

(52) U.S. Cl.
USPC ......... 455/323; 455/240.1; 455/334; 375/345

(58) Field of Classification Search
USPC ........ 455/131, 137, 138, 232.1, 234.1, 240.1, 455/323, 334, 339, 341; 375/345
See application file for complete search history.

(56) References Cited

U.S. PATENT DOCUMENTS

| | | | |
|---|---|---|---|
| 6,049,573 A | 4/2000 | Song | |
| 6,317,590 B1 * | 11/2001 | Nash et al. | 455/331 |
| 6,397,044 B1 * | 5/2002 | Nash et al. | 455/73 |
| 6,584,304 B1 | 6/2003 | Thomsen et al. | |
| 6,654,595 B1 * | 11/2003 | Dexter | 455/323 |
| 6,909,882 B2 | 6/2005 | Hayashi et al. | |
| 6,909,883 B2 | 6/2005 | Fujiwara | |
| 6,970,688 B2 | 11/2005 | Nibe | |

(Continued)

FOREIGN PATENT DOCUMENTS

EP    1 376 851    2/2004
WO    WO 00/52819 A1    9/2000

OTHER PUBLICATIONS

Klumperink, E.A.M, "A CMOS Switched Transconductor Mixer In: SOlid-State Circuits", IEEE Journal, vol. 39, No. 8, Aug. 2004, pp. 1231-1240.

(Continued)

*Primary Examiner* — Nhan Le
(74) *Attorney, Agent, or Firm* — Trop, Pruner & Hu, P.C.

(57) ABSTRACT

In one embodiment, the present invention includes a method for receiving a radio frequency (RF) signal and mixing the RF signal with a master clock to obtain a mixed signal, cyclically rotating the mixed signal to each of N gain stages for at least one cycle of the master clock, and summing the outputs of the N gain stages to provide an output signal.

12 Claims, 10 Drawing Sheets

(56) References Cited

U.S. PATENT DOCUMENTS

| | | |
|---|---|---|
| 6,996,379 B2 | 2/2006 | Khorram |
| 7,158,768 B2 | 1/2007 | Woo et al. |
| 7,187,913 B1 | 3/2007 | Rahn et al. |
| 7,236,212 B2 | 6/2007 | Carr et al. |
| 7,251,468 B2 | 7/2007 | Ruelke et al. |
| 7,324,797 B2 | 1/2008 | Drentea |
| 7,359,678 B2 | 4/2008 | Hayashi et al. |
| 7,366,486 B2 | 4/2008 | Vorenkamp et al. |
| 7,392,026 B2 | 6/2008 | Alam et al. |
| 7,395,087 B2 | 7/2008 | Watanabe |
| 7,457,606 B2 | 11/2008 | Kim |
| 7,460,844 B2 | 12/2008 | Molnar et al. |
| 7,509,110 B2 | 3/2009 | Hayashi et al. |
| 7,756,504 B2 * | 7/2010 | Rafi et al. .............. 455/323 |
| 7,860,480 B2 | 12/2010 | Rafi |
| 7,986,926 B2 | 7/2011 | Rafi et al. |
| 8,260,244 B2 * | 9/2012 | Rafi et al. .............. 455/323 |
| 8,285,240 B2 | 10/2012 | Seendripu |
| 8,374,568 B2 | 2/2013 | Seendripu et al. |
| 8,374,569 B2 | 2/2013 | Seendripu et al. |
| 8,374,570 B2 | 2/2013 | Seendripu et al. |
| 8,503,962 B2 * | 8/2013 | Rafi et al. .............. 455/302 |
| 8,571,512 B2 * | 10/2013 | Rafi .............. 455/326 |
| 2003/0138062 A1 | 7/2003 | Smith |
| 2005/0107055 A1 | 5/2005 | Bult et al. |
| 2006/0068746 A1 | 3/2006 | Feng et al. |
| 2006/0128334 A1 | 6/2006 | Ikuta et al. |
| 2006/0128338 A1 | 6/2006 | Kerth et al. |
| 2006/0159202 A1 | 7/2006 | Breiling |
| 2006/0160518 A1 | 7/2006 | Seendripu |
| 2006/0286939 A1 | 12/2006 | Yamawaki et al. |
| 2007/0117530 A1 | 5/2007 | Davis |
| 2007/0129034 A1 | 6/2007 | Adams et al. |
| 2007/0135074 A1 | 6/2007 | Igarashi et al. |
| 2007/0207760 A1 | 9/2007 | Kavadias et al. |
| 2008/0081568 A1 | 4/2008 | Kanaya |
| 2011/0065411 A1 | 3/2011 | Rafi |
| 2013/0052975 A1 | 2/2013 | Rafi et al. |

OTHER PUBLICATIONS

U.S. Patent and Trademark Office, Office Action mailed Dec. 13, 2011 in U.S. Appl. No. 13/029,344.

U.S. Patent and Trademark Office, Office Action mailed Oct. 24, 2011 in U.S. Appl. No. 12/794,113.

U.S. Appl. No. 11/528,051, filed Sep. 27, 2006, entitled "Harmonic Rejection Mixer," by Daniel J. Cooley, et al.

U.S. Appl. No. 11/824,417, filed Jun. 29, 2007, entitled "A Rotating Harmonic Rejection Mixer," by Aslamali A. Rafi, et al.

Jeffrey A. Weldon, et al., "A 1.75GHz Highly-Integrated Narrow-Band CMOS Transmitter With Harmonic-Rejection Mixers," Dec. 2001, pp. 2003-2015.

Raja S. Pullela, et al., "Low Flicker-Noise Quadrature Mixer Topology," 2006, pp. 1-10.

U.S. Appl. No. 14/020,426, filed Sep. 6, 2013, entitled "Method and Apparatus for Controlling a Harmonic Rejection Mixer," by Aslamali A. Rafi, et al.

U.S. Appl. No. 14/010,993, filed Oct. 25, 2013, entitled "Rotating Harmonic Rejection Mixer," by Aslamali A. Rafi, et al.

* cited by examiner

METHOD AND APPARATUS FOR CONTROLLING A HARMONIC REJECTION MIXER

This application is a continuation of U.S. patent application Ser. No. 12/947,285, filed Nov. 16, 2010, which is a divisional of U.S. patent application Ser. No. 11/824,418, filed Jun. 29, 2007, now U.S. Pat. No. 7,860,480, issued Dec. 28, 2010, the content of which is hereby incorporated by reference.

FIELD OF THE INVENTION

Embodiments of the present invention relate to a mixer and more particularly to methods and apparatus for operating a mixer to perform harmonic rejection.

BACKGROUND

A conventional receiver may include at least one mixer to downconvert the frequency of an incoming signal. More specifically, the mixer typically multiplies the incoming wireless signal with a local oscillator signal to produce a signal that has spectral energy that is distributed at sums and differences of the local oscillator and incoming signal's frequencies. For a downconversion mixer, the desired output is the difference between the local oscillator and incoming signal frequency. If the local oscillator signal is a pure sinusoid only the spectral energy of the incoming signal that is at an intermediate frequency (IF) away from the local oscillator (LO) signal appears at the output of the downconversion mixer. However, for certain mixing applications, the local oscillator signal may be a non-sinusoidal, such as a square wave signal, which contains spectral energy that is located at a fundamental frequency and additional spectral energy that is located at harmonic frequencies of the fundamental frequency. Mixing the incoming signal with such a local oscillator signal causes the spectral energy of the incoming signal at IF away from the harmonics of the LO signal to also appear along with the desired signal at the downconversion mixer's output.

Harmonic rejection mixers exist that include multiple mixers such as Gilbert cell type mixers to each receive a scaled version of an incoming signal, where the outputs of each mixer stage are summed to provide a downconverted (or upconverted) output. Each mixer may operate at a phase difference from the other mixers, and each scaling factor that scales the incoming signal may be in accordance with a predetermined sinusoidal function such that the harmonic rejection mixer ideally rejects all harmonics except $M \times N +/- 1$, where M is any integer and N is the number of individual mixer stages. However, actual implementations do not operate according to this ideal. Instead, in practical implementations in a semiconductor integrated circuit (IC) process, various problems exist. These problems include difficulties in device matching among the different mixers, as random device mismatches between active devices, i.e., transistors in the mixers may cause the scaling factors to deviate from an ideal value, causing degradation in harmonic rejection. Furthermore, the phases of a LO signal provided to each branch may also deviate, causing harmonic rejection degradation.

To overcome such problems in conventional harmonic rejection mixers, very large device sizes are needed, which creates circuits that are very large and consume significant power. Furthermore, even if a large size is implemented such that the standard deviation of random mismatches is reduced (in turn raising power and area by a factor of 4), harmonic rejection can still be affected by the duty cycle of each LO waveform. Accordingly, positive and negative LO signals should be exactly 180 degrees out of phase, requiring additional well-matched components and operation at higher frequencies, again causing more consumption of power to achieve a desired performance level. In many designs, the amount of harmonic rejection that can realistically be achieved in such a mixer may be between approximately 30-40 dB, when operating at an LO frequency of several hundred MHz. Such performance may be acceptable for some applications. However, operation at this level can cause stricter tolerances for other components in a total budget for a given receiver design.

Thus, there exists a continuing need for a mixer that rejects harmonic frequencies that may be introduced by a local oscillator signal that is not a pure sinusoid.

SUMMARY OF THE INVENTION

In one aspect, the present invention is directed to a mixer that includes a mixer circuit to receive and generate a mixed signal from a radio frequency (RF) signal and a master clock signal, a switch stage coupled to an output of the mixer circuit to rotatingly switch the mixed signal to multiple gain stages coupled to the switch stage, and a combiner to combine an output of the gain stages. In some implementations, the mixer may be a quadrature mixer having in-phase and quadrature portions, and the gain stages may be weighted according to predetermined values, and outputs of the gain stages can be added together to obtain a mixed signal. By using such a mixer, harmonic rejection may be reduced or prevented, in some embodiments.

Yet another aspect of the present invention is directed to a method for operating a harmonic rejection mixer. The method may include receiving an RF signal and mixing the RF signal with a master clock to obtain a mixed signal, cyclically rotating the mixed signal to each of N gain stages for at least one cycle of the master clock (which may occur during a cycle of a LO), and summing the outputs of the N gain stages to provide an output signal. The cyclical rotation of the mixed signal from a first one to a second one of the gain stages may occur, for example, when the master clock is at a low value, and may further occur such that each of the gain stages is to receive the mixed signal for a portion of the LO cycle. In some implementations, the rotation may occur to less than all of the gain stages, based at least in part on a frequency of the RF signal.

Yet another aspect of the present invention is directed to an apparatus that includes a master RF device to receive an incoming RF signal and provide an RF current, where the master RF device includes at least one transconductor. The apparatus may further include a master LO device coupled to an output of the master RF device, where the master LO device receives the RF current and mixes it with a master clock signal to obtain a mixed signal, and a rotating switch device coupled to the master LO device to cyclically switch the mixed signal to one of multiple output ports of the rotating switch device. Coupled to these output ports are corresponding mixer loads to perform gaining and filtering of the mixed signal, and multiple gain stages each coupled to one of the mixer loads to weight the output of the corresponding mixer load and provide an output to a summer. In various implementations, the gain stages include matched passive components and unmatched active components, while the master LO device includes unmatched active components.

Yet another aspect of the present invention is directed to a system that includes a low noise amplifier (LNA) to receive an RF signal, a voltage controlled oscillator (VCO) to generate a VCO frequency, a frequency divider to divide the VCO frequency to obtain a master clock signal, a mixer coupled to an output of the LNA to mix the RF signal with the master clock signal to obtain a mixed signal, and a switch coupled to an output of the mixer to switch the mixed signal to a plurality of gain stages. In one embodiment, the system may further include a summer to combine outputs of the gain stages, a low pass filter (LPF) coupled to an output of the summer, an analog-to-digital converter (ADC) coupled to an output of the LPF; and a demodulator coupled to an output of the ADC.

A still further aspect of the present invention is directed to a method for receiving a request for a channel at a first frequency, determining a number of stages to be enabled in a mixer based at least in part on the first frequency, selecting a master clock frequency corresponding to a multiplied version of a local oscillator (LO) frequency, providing the master clock frequency to a mixer, and mixing an RF signal that includes the channel with the master clock frequency and providing a mixed signal to each of the enabled stages individually for a portion of each LO cycle. The number of enabled stages may be less than all available stages if the channel is in a band less than a predetermined frequency. Note than when a request for a second channel at a second frequency is received, the number of stages to be enabled may be updated based on the second frequency.

DETAILED DESCRIPTION

Figure 1:
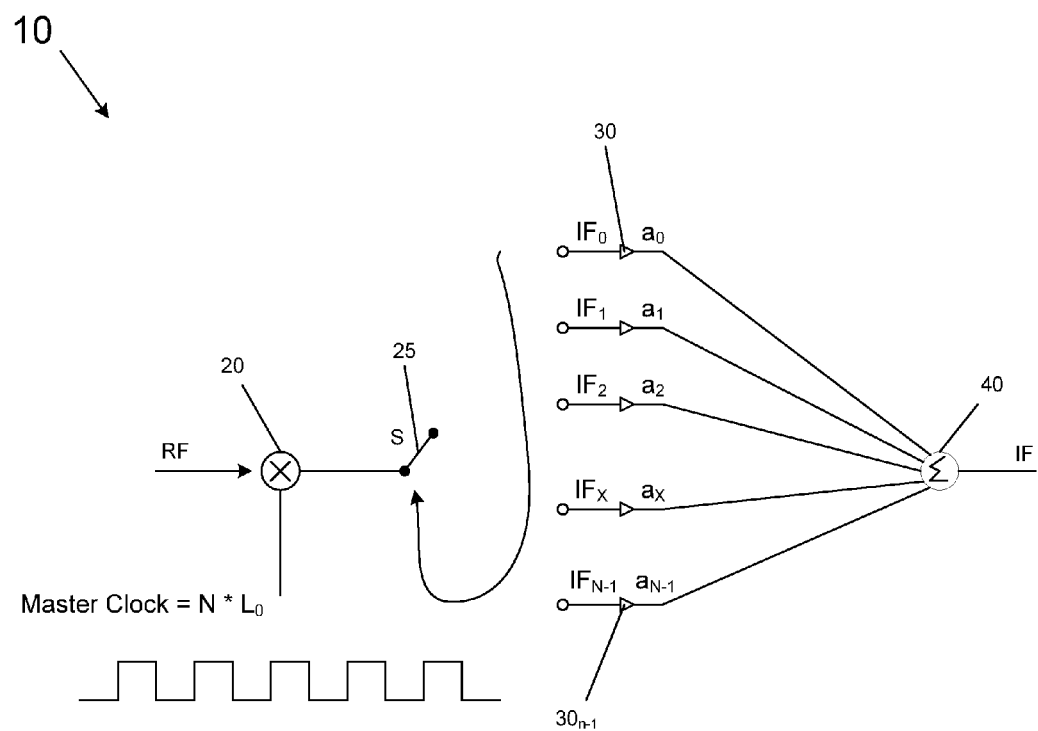
FIG. 1 is a high level block diagram of a mixer in accordance with an embodiment of the present invention.

In various embodiments, a rotating harmonic rejection mixer may be provided to enable improved harmonic rejection for a mixing operation between an incoming radio frequency (RF) signal and a clock frequency signal, such as master clock which may be a square wave signal whose frequency is a multiplied version of a local oscillator (LO) frequency. In various embodiments, the rotating harmonic rejection mixer may be controlled to enable some or all of a plurality of gain stages of an intermediate frequency (IF), which are then summed to provide an output IF signal for further processing in a given receiver. As used herein, the term "rotating" means that an output of a mixing operation is cyclically rotated to different IF gain stages during a given time period.

Due to the design of the mixer in which the incoming RF signal is downmixed, e.g., to an IF frequency, after which this IF signal is processed by way of gaining, filtering and so forth, any mismatch-causing devices do not operate at high frequencies. Accordingly, better matching passive components may be used and feedback around active devices is also implemented to improve harmonic rejection at significantly lower power and area consumption. Furthermore, in various implementations a mixer may include a single RF device, e.g., a single differential transconductor controlled by a single switching pair. Because there is only a single RF device, no mismatches occur in the RF section.

Furthermore, these front-end devices, i.e., in the RF portion and a local oscillator path, can be formed of minimal-sized devices leading to improved power and area reductions. Also, by using such smaller size devices, bandwidth of a front-end amplifier that provides signals to the mixer, such as a low noise amplifier (LNA) may be increased, as mixer input capacitance can be significantly reduced. In this way, LNA power dissipation may be reduced while providing more flexibility for selection and design of an LNA. In some implementations, resistor areas in an IF section may be optimized such that resistors implementing the peak of a sine wave implementing the phases of the individual IF portions can be wider than those at the rising portion of the sine wave.

While the scope of the present invention is not limited in this regard, such a mixer may be incorporated into various receivers such as a television receiver, radio receiver or other receiver of incoming RF signals. Because the number of such gain stages can be dynamically controlled, embodiments may provide for control of an amount of harmonic rejection to be provided, which may vary given a frequency at which the incoming signals are received. For example, in the context of a television receiver, incoming signals may be received via broadcast of over-the-air signals at VHF or UHF frequencies or via broadband cable at a higher frequency. Depending upon the frequency at which the tuner operates, differing amounts of gain stages may be provided to enable a controllable amount of harmonic rejection to be realized, while also preventing flicker noise in the mixer. Furthermore, by reducing the number of gain stages enabled during operation at certain frequencies, reduced power consumption may be realized.

Referring now to FIG. 1, shown is a block diagram of a mixer system in accordance with an embodiment of the present invention. As shown in FIG. 1, mixer system 10 is coupled to receive an incoming RF signal at a mixer 20, which mixes the incoming signal with a master clock signal. The master clock may be at a frequency of N×LO, where N is an integer corresponding to a number of gain stages (discussed below) in mixer system 10 and LO is at an output frequency of an LO (not shown in FIG. 1). In various embodiments, the LO may include a voltage controlled oscillator (VCO) that generates a sine wave, that in turn may be modified into a square wave signal (e.g., via a frequency divider) along an LO path such that the master clock provided to mixer 20 is a square wave signal. Mixer 20 may thus multiply the incoming RF signal by the master clock and the result is then rotated between a plurality of individual gain stages $30_0$-$30_{N-1}$ (generically gain stage 30). As will be described further below, each gain stage 30 has a different gain factor $a_0$-$a_{N-1}$ associated therewith.

A switch 25 may be controlled to cyclically rotate the output from mixer 20 to each of gain stages 30. The angular velocity of rotation sets the effective LO frequency. For example, if switch 25 has completed one rotation in N cycles of the master clock, the effective LO equals the master clock frequency divided by N. In various implementations, switch 25 may be controlled to be connected to a given gain stage 30 when the LO is at a high value (i.e., when there is a signal through switch 25). When there is no signal through switch 25 (i.e., when the LO is at a low state), it may be rotated to the next gain stage 30. In this way, switch 25 does not contribute any noise, and any offsets within operation of switch 25 do not contribute to any harmonic rejection degradation.

Referring still to FIG. 1, each gain stage 30 has an input IF port (IF$_0$-IF$_{N-1}$) that is coupled to receive the output from mixer 20 when switch 25 enables interconnection to the given IF port. Each gain stage 30 scales signal at the IF ports (IF0 to IFn-1) by a different factor, or degree, to produce a resultant signal that is provided to a summer block 40 that combines the outputs of all such gain stages 30 to generate an IF output which may be provided to further circuitry of a tuner to process the received signal. Note that in FIG. 1, IF filters, which may be also referred to herein as mixer loads, that are present on each of the IF ports to enable gaining, filtering and conversion of current to voltage, and coupled between switch 25 and a corresponding gain stage, are not shown for ease of illustration.

Each gain stage 30 may have a different coefficient $a_0$-$a_{N-1}$ that may be selected to cancel harmonics in the incoming signal. More specifically, in some embodiments the $a_k$ coefficients where k equals zero to N−1 may be selected based on the following periodic function of the square wave phase:

$$a_k = \sin\left(\frac{2\pi}{N}k\right). \quad [1]$$

By selecting a given value of N, the harmonics that are cancelled by mixer system 10 may be controlled. As described above, the summation of all of the individual gain blocks 30 (i.e., phases) may be summed at summer block 40 and provided to additional receiver circuitry.

Figure 2:
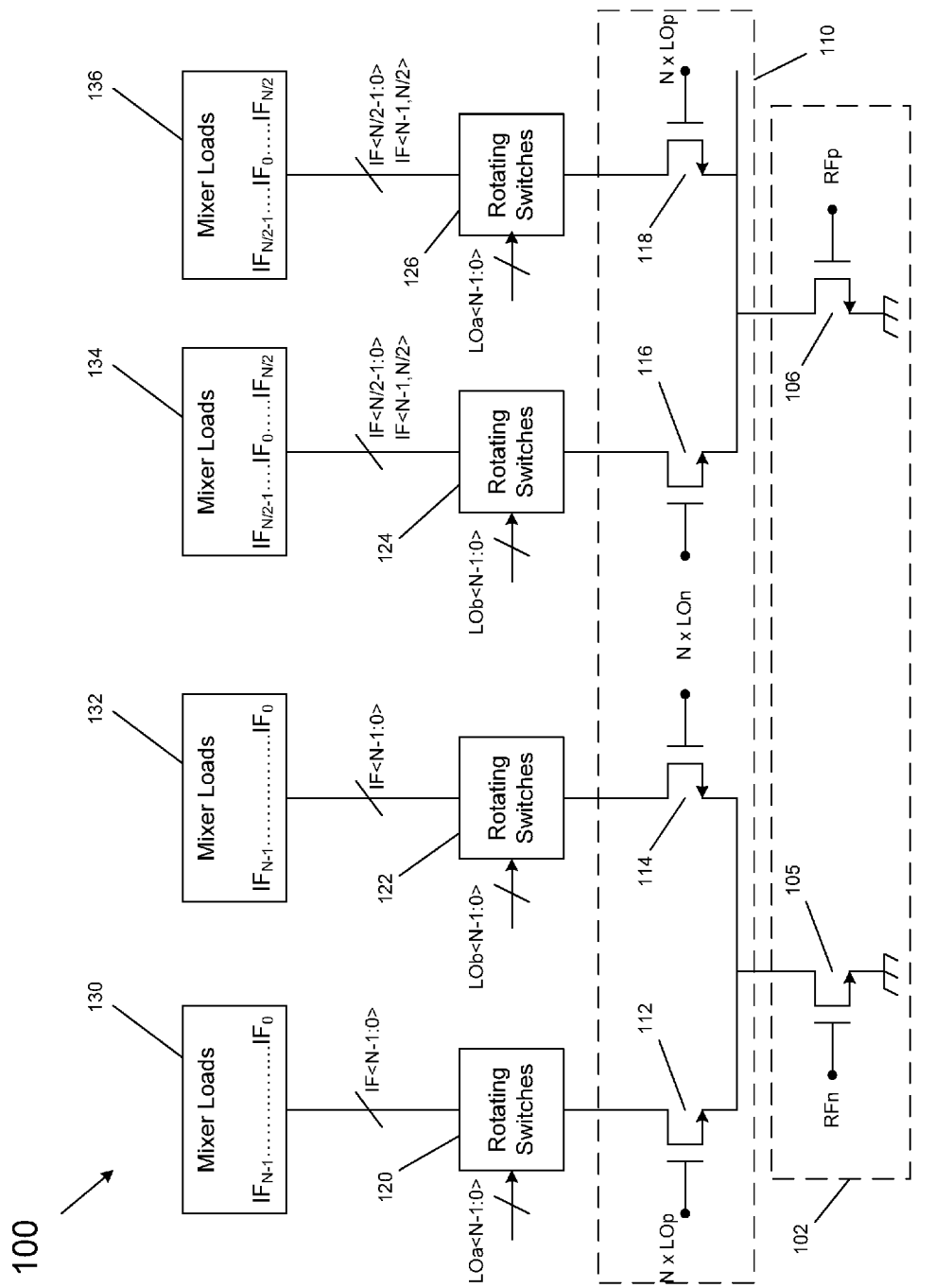
FIG. 2 is a block diagram of an implementation of a mixer in accordance with one embodiment of the present invention.

Implementations of a mixer to enable controllable harmonic rejection as well as noise immunity may take different forms. Referring now to FIG. 2, shown is a block diagram of an implementation of a mixer in accordance with one embodiment of the present invention. As shown in FIG. 2, mixer 100 is one example implementation in which an incoming RF signal having positive and negative components RF$_N$ and RF$_P$ are provided to master RF devices 102. As shown in FIG. 2, master RF devices 102 may include n-channel metal oxide semiconductor field effect transistors (nMOSFETs) 105 and 106 which act as transconductors having gate terminals connected to RF signals RF$_P$ and RF$_N$, respectively, and providing an RF current through a drain terminal. Thus only a single differential transconductor is present, avoiding any mismatch.

The outputs of master RF devices 102 are provided to master LO devices 110. Master LO devices 110 may act to mix the incoming RF signal with the master clock frequency. Specifically, as shown in FIG. 2 master LO devices 110 may include a plurality of nMOSFETs 112-118 having source terminals coupled to receive an RF output from master RF devices 102 and gate terminals coupled to receive the master clock signal (respectively N×LO$_p$ and N×LO$_N$) and having drain terminals to provide an IF output to a plurality of rotating switches 120-126 (generically rotating switch 120). Rotating switches 120 may be controlled by control signals, LO$_{a+b}$<N−1:0> (note LO$_a$ and LO$_b$ are distinct signals) respectively, to cyclically switch the output from the master clock devices to each of a plurality of IF output ports, IF<N−1:0>, that in turn are provided to a plurality of IF input ports (e.g., IF$_{N-1}$-IF$_0$) of a plurality of mixer loads 130-136 (generically mixer load 130).

Note that the rotating switches in the mixer processing the negative RF signal, namely RF$_n$, are connected differently to the IF ports, IF$_0$ to IF$_{n-1}$. Since RF$_n$ is 180 degrees phase shifted with respect its counterpart, RF$_p$, the rotating switches' outputs should also be phase shifted by 180 degrees. Since a rotation through N stages implies a phase shift of 360 degrees, a phase shift of 180 degrees is obtained by cyclically shifting through N/2 stages. Thus if a rotating switch in the mixer processing RF$_p$ was connected to the IF port, IF$_k$, then the corresponding rotating switch in the mixer processing RF$_n$ would be connected to IF port IF$_{(k+N/2)}$ or IF$_{(k-N/2)}$ depending on whether k was lesser than N/2 or not, respectively (thus the arrayed output of the rotating switches connected to mixer processing RF$_n$ is represented in FIG. 2 as IF<N/2−1:0>, (followed by), IF<N−1,N12> whereas the arrayed output of the rotating switches connected to mixer processing RFp is represented as IF<N−1,0>.) Mixer loads 130 may perform gaining and filtering of the IF signals, and may be RC filters in some embodiments. In some implementations, each such mixer load 130 may have the same RC weighting. The output of the respective mixer loads 130 may be provided through additional gain stages that may include buffers and impedances, and then on to summing blocks (not shown in FIG. 2), which sum the respective phases and provide the IF output to a desired location.

Figure 3:
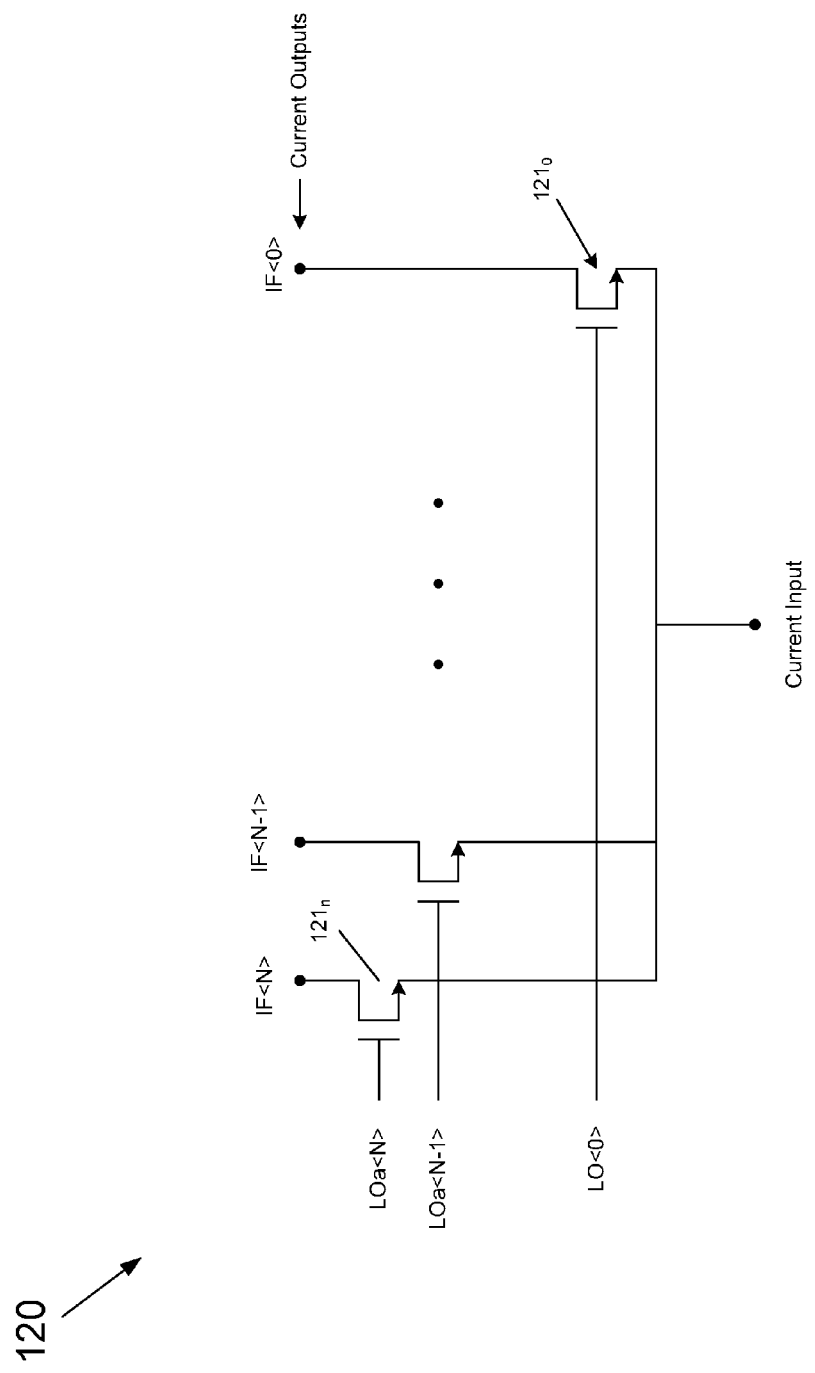
FIG. 3 is a schematic diagram of a rotating switch in accordance with an embodiment of the present invention.

Rotating switches such as switches 120 shown in FIG. 2 can be implemented in a variety of manners. Referring now to FIG. 3, shown is a schematic diagram of an example implementation for a rotating switch in accordance with an embodiment of the present invention. As shown in FIG. 3, rotating switch 120 may include a plurality of nMOSFETS 121$_N$-121$_0$ (generically MOSFET 121). As shown, each MOSFET 121 has a source terminal coupled to receive a current input from a master LO device 110. Further, each MOSFET 121 may have a gate terminal controlled by a different one of a plurality of control signals LO<0:N−1>. As described above, each MOSFET 121 may be cyclically controlled to enable each MOSFET 121 to output via its drain terminal the current input signal for a given portion of the LO cycle. Thus the outputs of rotating switch 120 may be provided at a plurality of output IF ports IF<0:N−1> that in turn couple to corresponding IF input ports of, e.g., mixer loads 130 of FIG. 2.

Figure 4:
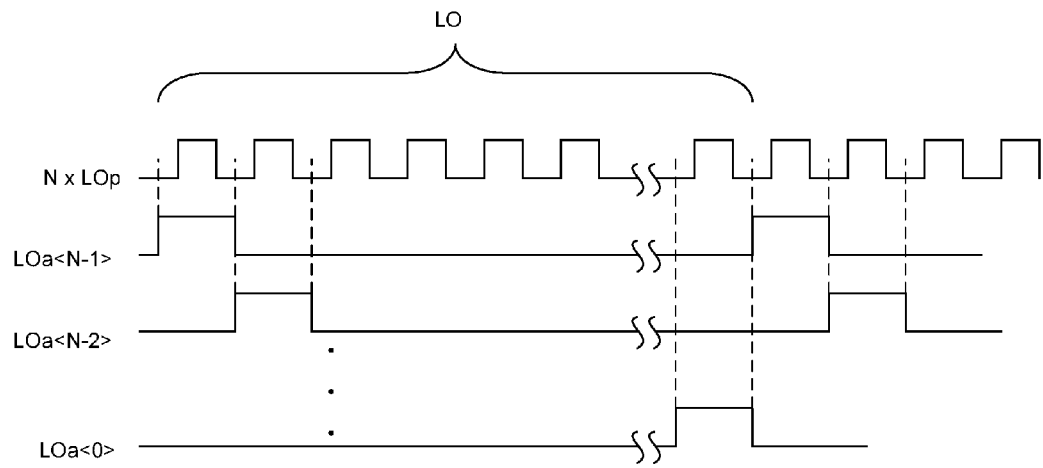
FIG. 4 is a timing diagram of control signals for a rotating switch in accordance with one embodiment of the present invention.

To enable rotating switch 120 to rotate the input current between its various outputs, the gates of MOSFETs 121 may be driven in accordance with the timing diagram shown in FIG. 4, in one embodiment. FIG. 4 shows the master clock frequency for the positive input current (i.e., N×LO$_p$) which is a square wave signal. As shown in FIG. 4, for a given period of the LO, N cycles of the master clock may be generated. In turn, each MOSFET of the rotating switches may be controlled cyclically by a given control signal LO$_a$<N−1:0>. Note that these control signals are also square wave signals that may have a pulse width equal to about a time period of the master clock. Furthermore, note that the control signals are individually enabled to a high state during a low portion of the master clock. While shown as switching at approximately halfway through a low state of the master clock frequency, the scope of the present invention is not limited in this regard. By enabling each MOSFET in turn, during a single period of the LO each MOSFET may be enabled for a time period of LO divided by N.

Figure 5:
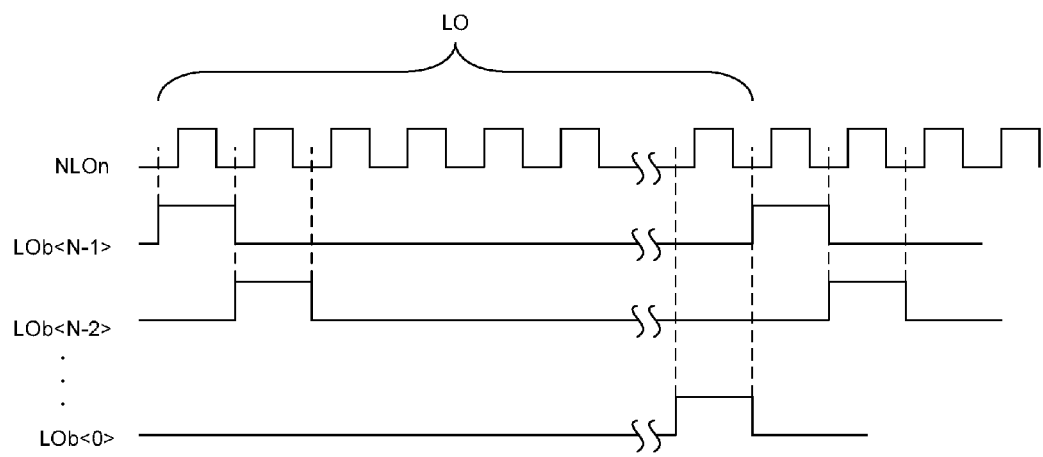
FIG. 5 is a timing diagram of complementary control signals for a rotating switch in accordance with one embodiment of the present invention.

As shown in FIG. 5, a similar timing mechanism may be enabled for the negative master clock signals, i.e., N×LO$_N$. Note that the positive and negative master clock frequencies are complementary versions of each other. The transitions in the control signals LO$_a$<K> and LO$_b$<K>, where K equals 0 to N−1 occur when the master clock is at a low state. Thus there is no current in the rotating switches when the gates of the MOSFETs are being toggled, and any random offsets between the MOSFETs in the rotating switches do not affect their output. Note that the same is true for any noise in the switches. Still further, when the master clock is at a high level, the MOSFETs of the rotating switches simply act as cascodes and thus their noise is not important. As a result, any mismatches in the master LO devices affect all outputs of the rotating switches equally. Still further, any mismatches in the master RF devices affect all outputs of the rotating switches equally, because it is the same RF current that is cyclically rotated between the different mixer outputs. Accordingly, mismatches in both the RF and LO devices do not cause any harmonic rejection degradation. Instead, the only components that could cause such harmonic rejection degradation are devices in the IF portions (i.e., mixer loads 130 of FIG. 2). For a downconversion mixer such as used in various receiver architectures, because the IF is at a much lower frequency than the received RF signal, negative feedback stages may be provided and any gain/phase errors caused by these stages are largely dependent on passive components such as resistors and capacitors, and not active components such as transistors. Because for a typical IC process such as a CMOS process, passive components match much better than their active counterparts, enabling mismatch errors between passive components can greatly reduce harmonic rejection degradation.

A mixer in accordance with an embodiment of the present invention thus shifts the device matching problem of harmonic rejection from high frequency RF/LO devices to lower frequency IF devices, and further shifts device matching issues from poorly matching active devices to better matching passive devices. Such a mixer can achieve improved harmonic rejection while reducing both power consumption and die area consumed by the mixer.

Figure 6:
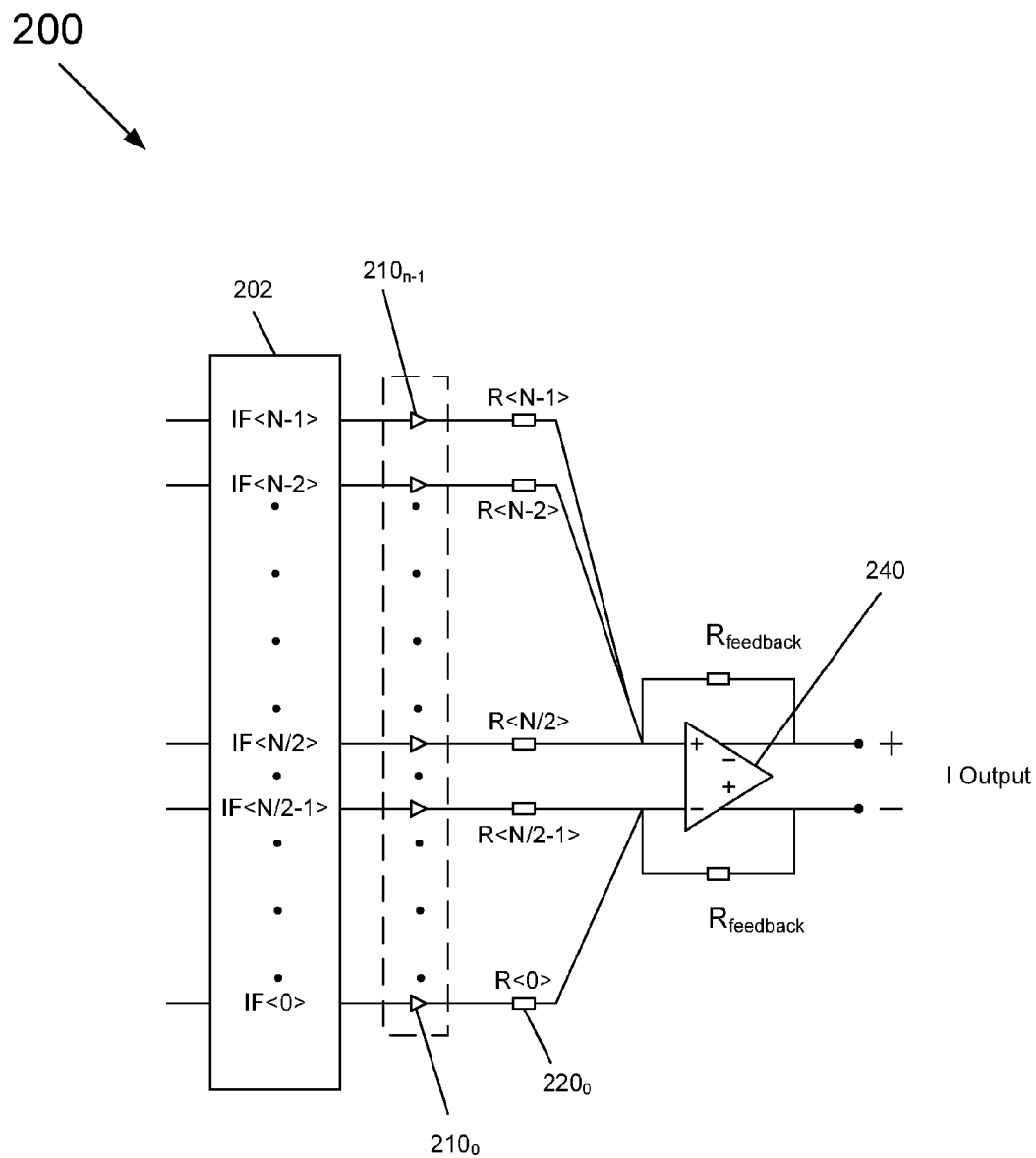
FIG. 6 is an example implementation of a gain stage of an intermediate frequency section in accordance with an embodiment of the present invention.

As described above, in some embodiments mixer loads 130 of FIG. 2 may be implemented as RC filters. Referring now to FIG. 6, shown is an example implementation of a gain stage of an IF section in accordance with an embodiment of the present invention. As shown in FIG. 6, IF section 200 includes a plurality of IF input ports, IF<N−1>–IF<0>, to receive the output of the master RF and LO devices and mixer loads of FIG. 2 (generically 202). Each input port is coupled to a respective unity gain buffer 210$_{N-1}$-210$_0$. While the scope of the present invention is not limited in this regard, in one embodiment a unity gain buffer may be implemented with a pair of MOSFETs, namely a pMOSFET coupled to receive incoming voltage at a gate terminal and having source and drain terminals coupled to different current sources, respectively. In turn, a second MOSFET, which may be a nMOSFET, may have a gate terminal coupled to a drain terminal of the first MOSFET, a source terminal coupled to ground, and a drain terminal coupled to an output terminal (also coupled to the source terminal of the first MOSFET). Such a gain buffer may have a gain set in accordance with the following equation:

$$\frac{Vout}{Vin} = \frac{A}{1+A} \quad [2]$$

where A is the open loop gain of unity gain buffer. Note that a large value for A may help reduce mismatch in gains.

Referring still to FIG. 6, unity gain buffers 210 are each coupled to a corresponding resistance 220$_{N-1}$-220$_0$. In various embodiments, each resistance 220 may be of a different value. More specifically, in one embodiment:

$$R_I\langle k\rangle = \frac{Runit}{\sin\left(\frac{2\pi}{N}k\right)} \text{ for } k = 0 \text{ to } N-1 \quad [3]$$

where Runit is a unitary or normalized resistance value. In some implementations, the unitary resistance value may be based on a resistor ratio such that the different resistors approximate a sine wave as closely as possible to improve harmonic rejection. In some embodiments, the integer ratios may be implemented with resistors connected in parallel for each of $R_I$<k>, with each resistor of a uniform length/width. These resistor ratios may be integer approximations of a sine wave in some embodiments. For example, in one implementation for 16 sine wave coefficients, a plurality of integer values may be chosen to provide for third order harmonic rejection of approximately 56 dB, with fifth order harmonic rejection of approximately 53 dB and seventh order harmonic rejection of approximately 48 db. As shown in Table 1 below, various integer fits for a sine wave may be used in different embodiments, which provide for various levels of harmonic rejection, in one implementation.

TABLE 1

| Sine wave coefficient (N = 16) | | | | | | | | dB S/3 | dB S/5 | dB S/7 | dB S/9 |
|---|---|---|---|---|---|---|---|---|---|---|---|
| 9 | 17 | 22 | 24 | 22 | 17 | 9 | 0 | 56 | 53 | 48 | 51 |
| 2 | 12 | 20 | 25 | 26 | 23 | 17 | 8 | 47 | 56 | 42 | 54 |
| 8 | 17 | 23 | 26 | 25 | 20 | 12 | 2 | 47 | 56 | 52 | 54 |
| 3 | 13 | 21 | 26 | 27 | 24 | 17 | 8 | 52 | 50 | 48 | 51 |
| 8 | 17 | 24 | 27 | 26 | 21 | 13 | 3 | 52 | 50 | 48 | 51 |
| 4 | 14 | 22 | 27 | 28 | 24 | 17 | 7 | 45 | 46 | 51 | 53 |
| 4 | 15 | 24 | 29 | 30 | 26 | 18 | 8 | 51 | 49 | 48 | 51 |
| 8 | 18 | 26 | 30 | 29 | 24 | 15 | 4 | 51 | 49 | 49 | 51 |

Furthermore, if quarter sine wave coefficients are used, integer ratios of 0, $9^{1/5}$, 17, $22^{1/5}$, and 24 may be realized for a quarter sine wave, providing harmonic rejection in excess of 65 dB. By using integers to approximate a sine wave, immunity from end effects and modeling errors may be realized. Note further that the different weighting values used may be applied in different order to the phases than that shown above.

Still referring to FIG. 6, the outputs of each resistance 220 is provided to a differential amplifier 240, which acts to sum all of the signals and provide a differential voltage output $I_{output}$ at a desired IF frequency. Note that feedback resistors, $R_{feedback}$, are coupled between the respective output and input terminals of differential amplifier 240. While shown with this particular implementation in the embodiment of FIG. 6, the scope of the present invention is not limited in this regard. For example, in other implementations rather than the unity gain buffers followed by resistors of FIG. 6, transconductors may be used instead.

FIG. 6 thus shows an implementation that provides a differential IF signal. In other implementations, quadrature signals may be obtained using a different implementation by providing another set of unity gain buffers that in turn are coupled to another set of resistances whose values mimic a "cosine" wave rather than a "sine" wave. In such an implementation, the quadrature phase resistances may be in accordance with the following equation:

$$R_Q \langle k \rangle = \frac{Runit}{\cos\left(\frac{2\pi}{N}k\right)} \text{ for } k = 0 \text{ to } N - 1 \quad [4]$$

Figure 7:
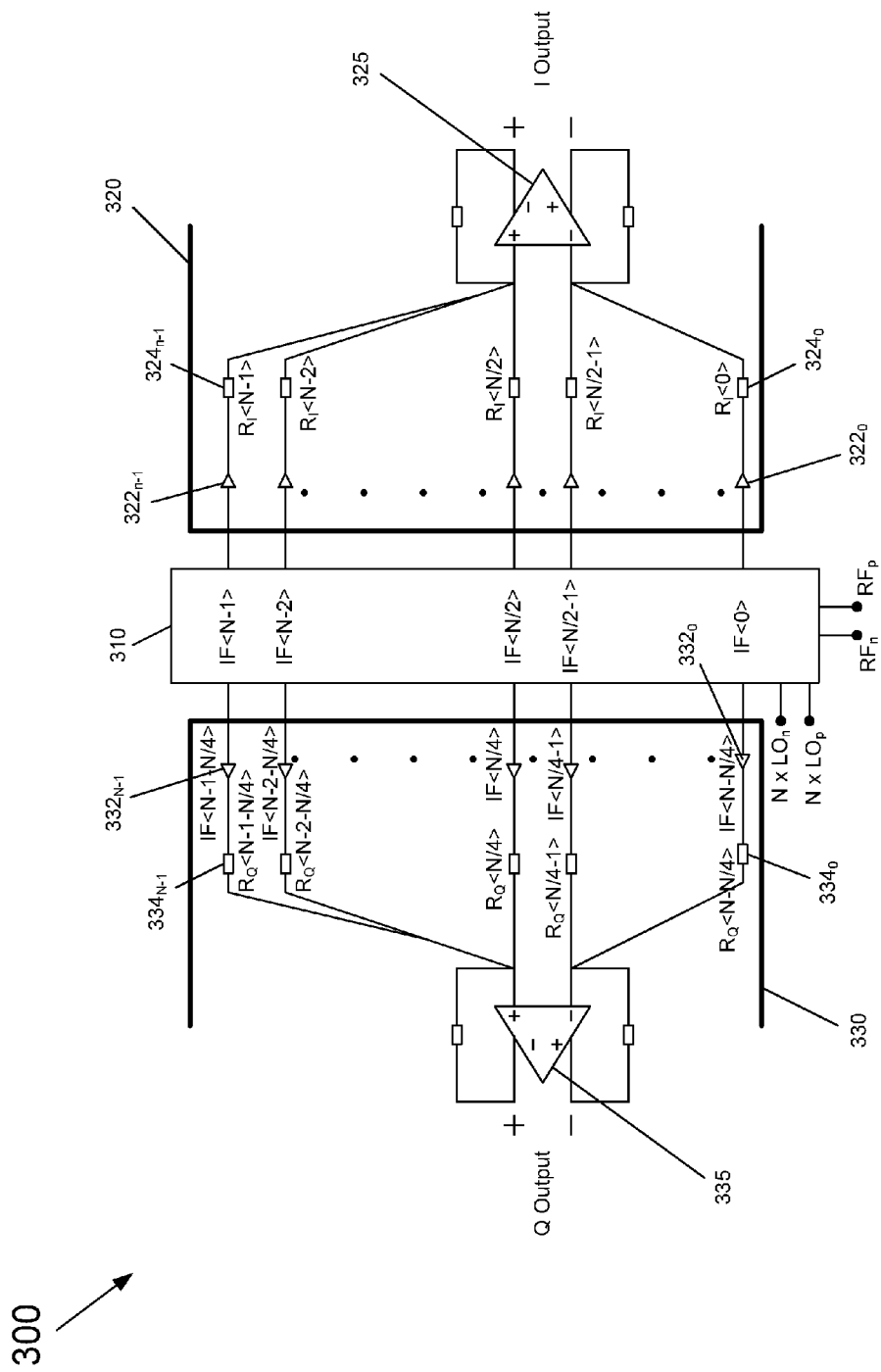
FIG. 7 is a schematic diagram of a quadrature mixer in accordance with an embodiment of the present invention.

Referring now to FIG. 7, shown is a schematic diagram of a quadrature mixer in accordance with an embodiment of the present invention. As shown in FIG. 7, mixer 300 may be coupled to receive an incoming RF signal (i.e., $RF_N$ and $RF_P$) and positive and negative master clocks (i.e., $N \times LO_N$ and $N \times LO_P$) and mix these signals in a mixer portion 310 which then provides IF outputs to an in-phase IF portion 320 and a quadrature-phase IF portion 330. As described above, in-phase IF portion 320 may include a plurality of unity gain buffers $322_{N-1}$-$322_0$ that in turn are coupled to resistances $324_{N-1}$-$324_0$, outputs of which in turn are provided to a differential amplifier 325. Similarly, quadrature in-phase IF portion 330 may include a plurality of unity gain buffers $332_{N-1}$-$332_0$ that in turn are coupled to resistances $334_{N-1}$-$334_0$, outputs of which are provided to a differential amplifier 335. In this way, mixer 300 provides I and Q IF outputs.

In various embodiments, improved image rejection may be realized in a quadrature mixer. This is so, as matching between I and Q outputs is solely determined by matching in the IF section, for the same reasons discussed above. That is, because mismatches and the master LO devices and master RF devices do not cause any gain/phase errors between the different IF<k> outputs, the quadrature signals derived from these IF outputs have improved image rejection.

In addition to improved harmonic and image rejection provided by embodiments of the present invention, better second-order intermodulation products ($IP_2$) also can be achieved.

Figure 8:
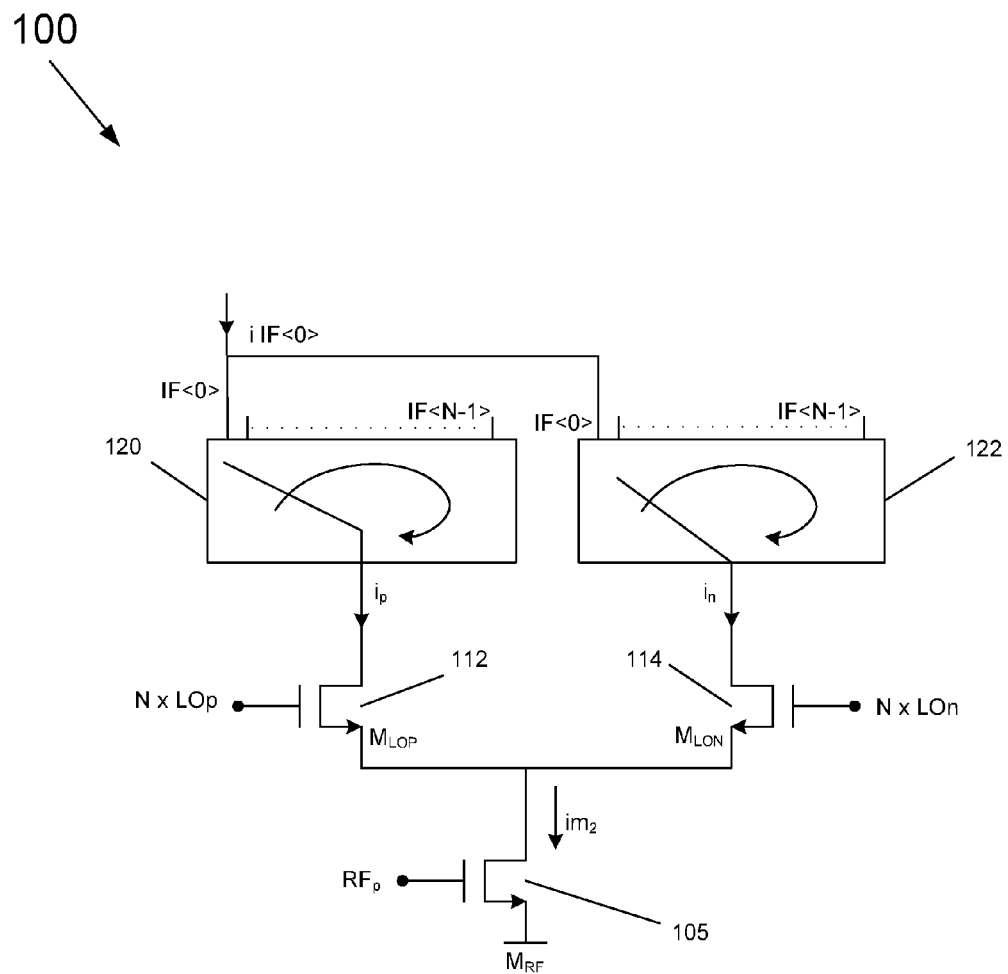
FIG. 8 is a block diagram of a portion of a rotating harmonic rejection mixer in accordance with an embodiment of the present invention.

Referring now to FIG. 8, shown is a block diagram showing a portion of a rotating harmonic rejection mixer in accordance with an embodiment of the present invention. Note mixer 100 of FIG. 8 may correspond to the positive portion of mixer 100 shown in FIG. 2. Thus, an incoming RF signal is passed through a transconductor 105, providing positive and negative current portions $I_P$ and $I_N$ through MOSFETs 112 and 114. In turn, these currents are switched through rotating switches 120 and 122. Only a single one of the switch outputs is shown, namely $IF_0$, from rotating switches 120 and 122. This current $I_{IF}<0>$ is thus a combination of the individual positive and negative currents from rotating switches 120 and 122.

Figure 9:
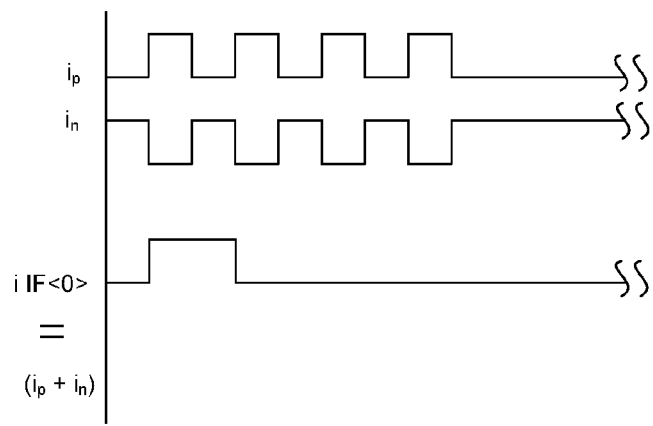
FIG. 9 is a timing diagram of an IF current of a single IF stage in accordance with one embodiment of the present invention.

Referring now to FIG. 9, shown is a time domain analysis of the IF current provided by such a single one of the IF output ports (i.e., $I_{IF}<k>$ for any k), which is a combination of both positive and negative currents provided by master LO devices 112 and 114 for the duration of one N×LO time period. As shown in FIG. 9, both the positive and negative input currents (Ip and In) are square waves that complement each other such that the combined current into any IF port has a pulse width equal to the sum of pulse widths of Ip and In. Thus, the pulse width of the current pulse into any IF port is equal to one period of N×LO clock.

Figure 10:
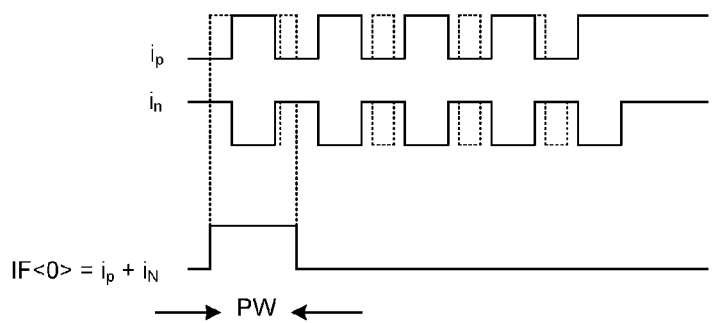
FIG. 10 is the timing diagram of FIG. 9 in the presence of mismatches in accordance with an embodiment of the present invention.

In the presence of mismatches in the active devices, e.g., in the master LO devices, the time domain of FIG. 9 may evolve into the time domain of FIG. 10, in which the dashed lines show the corresponding waveforms in the presence of mismatches in the active components of the master LO devices. Because of the complementary nature of the signals, mismatches in these master LO devices do not change the pulse width of the IF output current, $I_{IF}<k>$ for any k, as shown in FIG. 10. Accordingly, the low frequency $IM_2$ component appears the same way in each of the IF outputs and is ultimately cancelled in the IF stage as:

$$IF = \sum_{K=0}^{N-1} a_K \times IF \langle k \rangle \quad [5]$$

where $$a_k = \sin\left(\frac{2\pi k}{N}\right)$$

for k=0 to N−1, because for every k, $a_K = -a_{K+N/2}$. Accordingly, mismatches in the master LO devices do not contribute to $IP_2$ degradation and instead $IP_2$ degradation is solely determined by low frequency matching in the IF section, similar to that described above with regard to harmonic rejection degradation.

Figure 11:
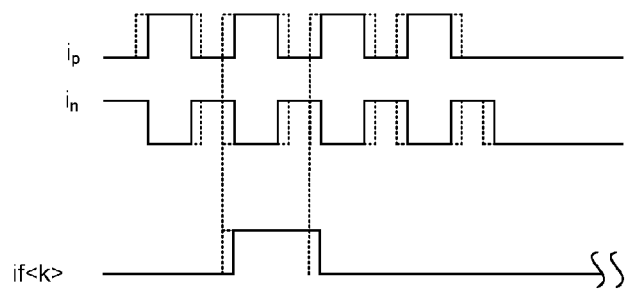
FIG. 11 is a timing diagram of an IF current of a single IF stage in the presence of noise in accordance with an embodiment of the present invention.

In addition to mismatches that may exist between the MOSFETs of the master LO devices, flicker noise may also be present. Referring now to FIG. 11, shown is a timing diagram of a current into a given IF port IF<k>, which is obtained by summing the positive and negative currents $I_N$ and $I_P$. As shown in FIG. 11, the dashed lines indicate current waveforms in the presence of flicker noise in the MOSFETs of the master LO devices. Note that the pulse width of IF<k> and thus the DC component is unaffected by this flicker noise. Accordingly, even in the single-ended outputs of IF<k>, flicker noise of the LO switching devices is absent. Accordingly, there is no need to rely on matching between positive and negative sides to obtain differential low flicker noise.

Still further, embodiments of the present invention provide for lower input referred thermal noise as compared to a conventional square wave mixer. That is, given the same total transconductor current, input referred noise of a mixer in accordance with an embodiment of the present invention may be significantly smaller, for example, on the order of $2(\pi^2/8)$, as noise downconversions from LO harmonics which may be present in a conventional mixer are absent in embodiments of the present invention.

Figure 12:
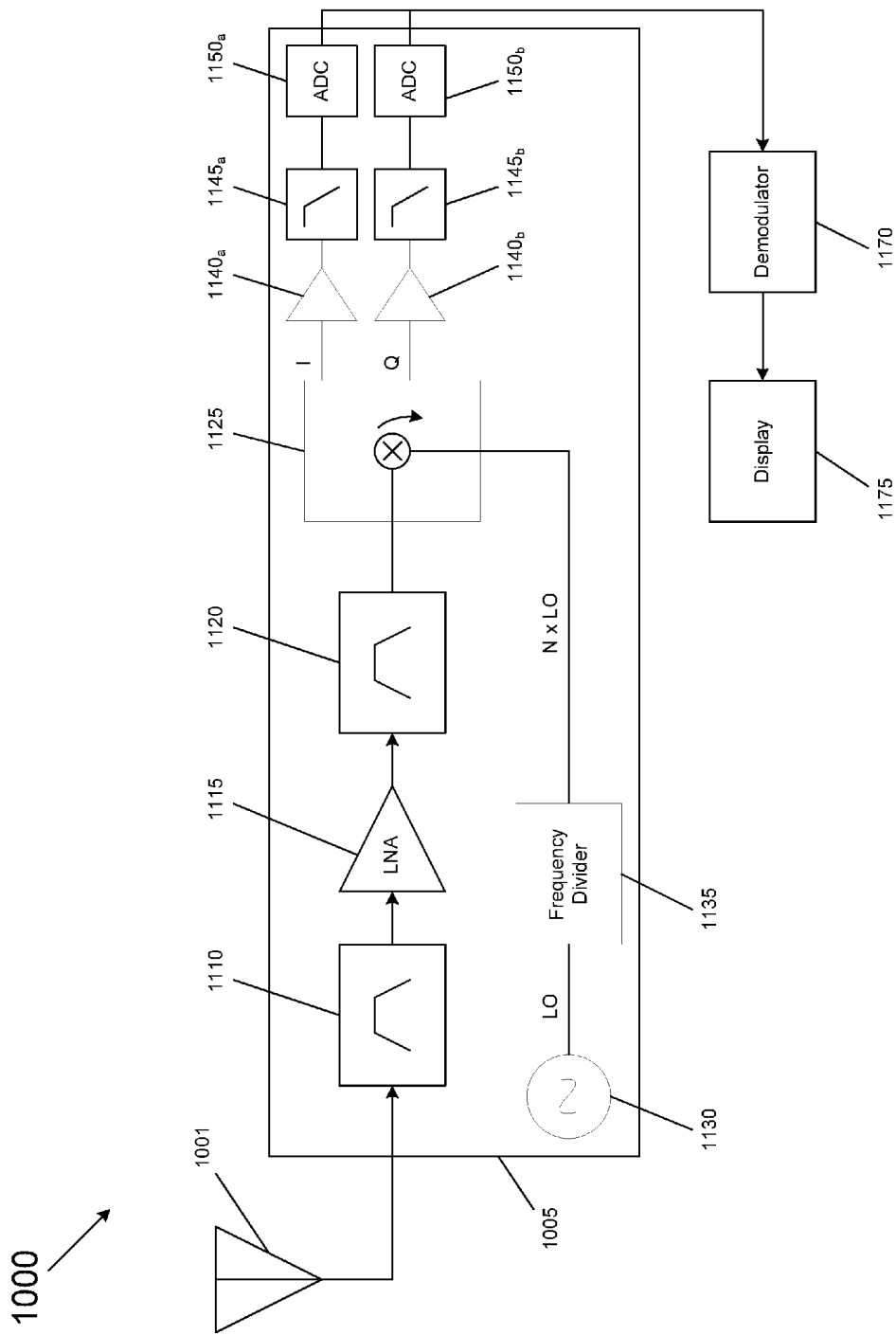
FIG. 12 is a block diagram of a system in accordance with one embodiment of the present invention.

Embodiments may be implemented in many different system types. As described above, applications may include mixed signal circuits that include both analog and digital circuitry. Referring now to FIG. 12, shown is a block diagram of a system in accordance with one embodiment of the present invention. As shown in FIG. 12, system 1000 may be a television that is coupled to receive a RF signal from an antenna source, cable distribution, or other source. The incoming RF signal may be provided to a television tuner 1005 which may be, in one embodiment a single-chip mixed signal device. Television tuner 1005 may incorporate embodiments of the present invention to provide improved harmonic and image rejection while consuming lower power and area.

Referring still to FIG. 12, tuner 1005 includes a bandpass filter 1110 having an output coupled to a low noise amplifier (LNA) 1115 to receive and amplify the RF signal from an antenna 1001. The output of LNA 1115 is provided to another bandpass filter 1120 that in turn is coupled to mixer 1125, which may be a rotating mixer in accordance with an embodiment of the present invention. As shown in FIG. 12, mixer 1125 receives a master clock signal having a frequency of N×LO from a frequency divider 1135 which in turn is coupled to receive a VCO frequency from a voltage control oscillator (VCO) 1130. While the scope of the present invention is not limited in this regard, the VCO frequency may be at a relatively high frequency, e.g., at least several GHz. In turn, frequency divider 1135 generates a divided frequency that is provided at the master clock value, which may be at a frequency of between approximately 1000 and 2000 MHz. In turn, mixer 1125 downconverts the incoming RF signal with the master clock signal to generate a complex IF output at a frequency of less than approximately 10 MHz. The complex I and Q IF signals output from mixer 1125 are provided to unity gain buffers 1140a and 1140b and are filtered by low-pass filters 1145a and 1145b and then may be digitized by ADCs 1150a and 1150b.

Referring still to FIG. 12, the digitized output of tuner 1005 may be provided to additional processing circuitry within television 1000, such as a demodulator 1170 and associated circuitry to enable a processed television signal to be provided to a display 1175. While shown with this particular implementation in the embodiment of FIG. 12, it is to be understood the scope of the present invention is not limited in this regard. Furthermore, it is to be understood that embodiments may be implemented in many different devices, such as receivers, transmitters and so forth. Still further, control logic, program storage or other computer readable media may be present to store instructions that when executed within a processor of tuner 1000 perform control of a number of gain stages, master clock frequencies, and thus harmonic rejection provided.

Figure 13:
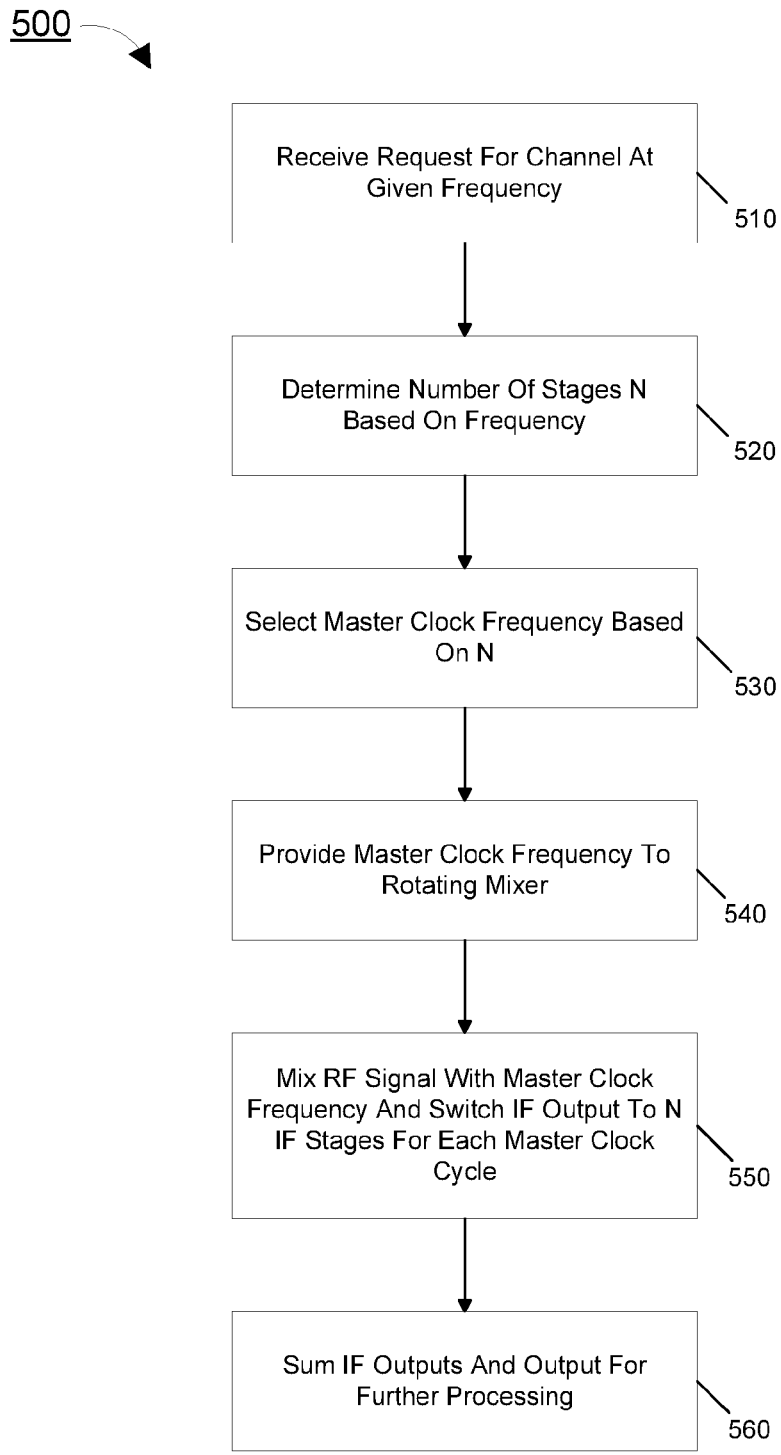
FIG. 13 is a flow diagram of a method in accordance with an embodiment of the present invention.

Referring now to FIG. 13, shown is a flow diagram of a method in accordance with an embodiment of the present invention. As shown in FIG. 13, method 500 may be used to dynamically adjust a number of gain stages in a mixer. By doing this, reduced power consumption may be realized while achieving a desired level of harmonic rejection, image rejection and so forth for incoming signals of a given frequency. As shown in FIG. 13, method 500 may begin by receiving a request for a channel at a given frequency (block 510). For example, a tuner that is part of a television receiver may receive a request from a user for programming on a certain channel. Based on that frequency, which is at a given frequency based on the band in which the channel is included, the number of stages N to be enabled in a mixer may be determined (block 520). For example, the following table shows the number of stages in the mixer (N) for different input frequency ranges. Having different values of N for different input frequency ranges enables a mixer to reject only desired number of harmonics while saving power in the front end dividers (e.g., 1135 in FIG. 12). The value of N may be controlled by programming of software, e.g., during incorporation of a tuner into a given system.

| Input Frequency Range | Mixer stages (N) |
| --- | --- |
| 40 MHz-125 MHz | 16 |
| 105 MHz-170 MHz | 12 |
| 155 MHz-255 MHz | 8 |
| 210 MHz-337 MHz | 6 |

Referring still to FIG. 13, then a master clock frequency may be selected based on this determined number of stages N (block 530). That is, a LO frequency may be provided to a clock multiplier, frequency divider or so forth that generates a master clock frequency of N.LO. This master clock frequency may thus be provided to the rotating mixer (block 540). Using this signal and an incoming RF signal that includes the desired channel, a mixing operation may occur such that a mixed signal corresponding to an IF signal may be switched to each of the N IF stages during each master clock cycle (block 550). The sum of these IF outputs for each clock cycle may be summed and sent along for further processing (block 560). While shown with this particular implementation in the embodiment of FIG. 13, the scope of the present invention is not limited in this regard. As described above, in some embodiments machine-readable instructions may implement the method of FIG. 13.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a master radio frequency (RF) device to receive an incoming RF signal and provide an RF output, the master RF device modifying the incoming RF signal;
   a master local oscillator (LO) device coupled to an output of the master RF device, the master LO device to receive the RF output and mix the RF output with a master clock signal to obtain a mixed signal;
   a rotating switch device coupled to the master LO device to cyclically switch the mixed signal to one of a plurality of output ports of the rotating switch device;
   circuitry coupled to each of the plurality of output ports for performing gaining, filtering and weighting of the mixed signal and providing a plurality of outputs; and
   a summer coupled to the plurality of outputs of the circuitry to generate a summer output.

2. The apparatus of claim 1, wherein the master LO device comprises a plurality of metal oxide semiconductor field effect transistors (MOSFETs) each having a first terminal to receive the RF output from the master RF device, a gate terminal to receive the master clock signal, and a second terminal to output the mixed signal.

3. The apparatus of claim 2, wherein the rotating switch device comprises a plurality of rotating switches each comprising a transistor to receive the mixed signal from the second terminal of the corresponding MOSFET and to output the mixed signal when the transistor is enabled by a control signal, wherein a value of the control signal is changed when a value of the master clock signal is at a low state.

4. The apparatus of claim 1, wherein the incoming RF signal is from an antenna source.

5. The apparatus of claim 1, wherein the incoming RF signal is from cable distribution.

6. The apparatus of claim 1, further comprising:
a low-pass filter coupled to the summer output for filtering the summer output and providing a filter output; and
an analog-to-digital converter coupled to the filter output to digitize the filter output and provide a tuner output signal.

7. The apparatus of claim 6, further comprising:
a demodulator having an input coupled to the tuner output signal to further process the tuner output signal.

8. The apparatus of claim 7, further comprising:
a display coupled to the demodulator, the display forming a television.

9. A method comprising:
receiving an incoming RF signal, modifying the incoming RF signal, and providing an RF output;
mixing the RF output with a master clock signal to obtain a mixed signal;
using a rotating switch device to cyclically switch the mixed signal to one of a plurality of output ports;
performing gaining, filtering and weighting of the mixed signal at each of a plurality of output ports of the rotating switch device and providing a plurality of outputs; and
summing the plurality of outputs to generate a summer output.

10. The method of claim 9, further comprising:
low pass filtering the summer output to provide a filtered output; and
converting the filtered output from an analog form to a digital form to provide a tuned output signal.

11. The method of claim 10, further comprising:
demodulating the tuned output signal to provide a further processed tuned output signal.

12. The method of claim 11, further comprising:
displaying the further processed tuned output signal as a television signal.

\* \* \* \* \*